United States Patent
Carminati et al.

(10) Patent No.: US 10,310,253 B2
(45) Date of Patent: Jun. 4, 2019

(54) MEMS DEVICE WITH PIEZOELECTRIC ACTUATION, A PROJECTIVE MEMS SYSTEM INCLUDING THE MEMS DEVICE AND RELATED CONTROL METHOD

(71) Applicant: STMicroelectronics S.r.l., Agrate Brianza (IT)

(72) Inventors: Roberto Carminati, Piancogno (IT); Domenico Giusti, Monza (IT); Sonia Constantini, Missaglia Lecco (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 84 days.

(21) Appl. No.: 15/594,287

(22) Filed: May 12, 2017

(65) Prior Publication Data

US 2018/0180873 A1    Jun. 28, 2018

(30) Foreign Application Priority Data

Dec. 28, 2016  (IT) .......................... 102016000131849

(51) Int. Cl.
```
G02B 26/08      (2006.01)
B81B 3/00       (2006.01)
G02B 26/10      (2006.01)
H04N 9/31       (2006.01)
```

(52) U.S. Cl.
CPC ........ *G02B 26/0858* (2013.01); *B81B 3/0083* (2013.01); *G02B 26/105* (2013.01); *H04N 9/3129* (2013.01); *B81B 2201/032* (2013.01); *B81B 2203/0118* (2013.01)

(58) Field of Classification Search
None
See application file for complete search history.

(56) References Cited

U.S. PATENT DOCUMENTS

| | | | |
|---|---|---|---|
| 5,519,198 A | 5/1996 | Plesko | |
| 2014/0198260 A1* | 7/2014 | Murayama | G02B 26/0858 348/744 |
| 2017/0343795 A1* | 11/2017 | Grutzeck | B81B 3/0062 |

FOREIGN PATENT DOCUMENTS

WO    WO-2016199730 A1    12/2016

OTHER PUBLICATIONS

U. Baran, "Resonant PZT MEMS Scanner for High-Resolution Displays", Journal of Micro-electro-mechanical Systems, vol. 21, No. 6, pp. 1303-1310, 2012.
IT Search Report and Written Opinion for IT 102016000131849 dated Oct. 5, 2017 (14 pages).

* cited by examiner

*Primary Examiner* — Jennifer D. Carruth
(74) *Attorney, Agent, or Firm* — Crowe & Dunlevy

(57) ABSTRACT

A MEMS device includes a fixed structure and suspended structure including an internal structure and a first arm and a second arm. Each arm has a first end fixed to the fixed structure and a second end fixed to the internal structure. The ends are angularly arranged at a distance apart. Piezoelectric actuators mounted to the arms are driven so as to cause deformation of the arm and produce a rotation of the internal structure. In a resting condition, each of the first and second arms has a respective elongated portion with a respective concavity. The internal structure extends in part within the concavities of the elongated portions of the first and second arms.

42 Claims, 7 Drawing Sheets

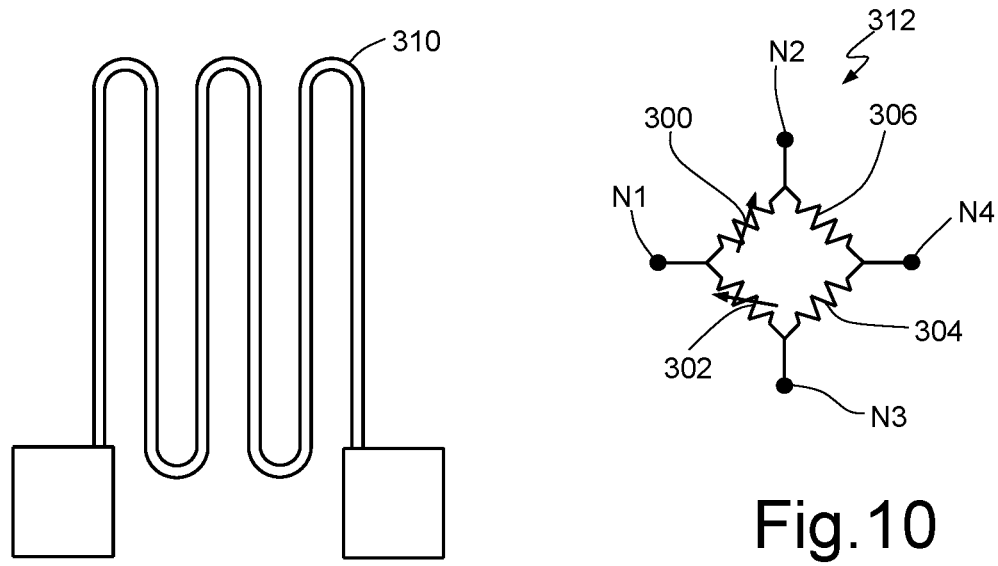
Fig.9
Fig.10
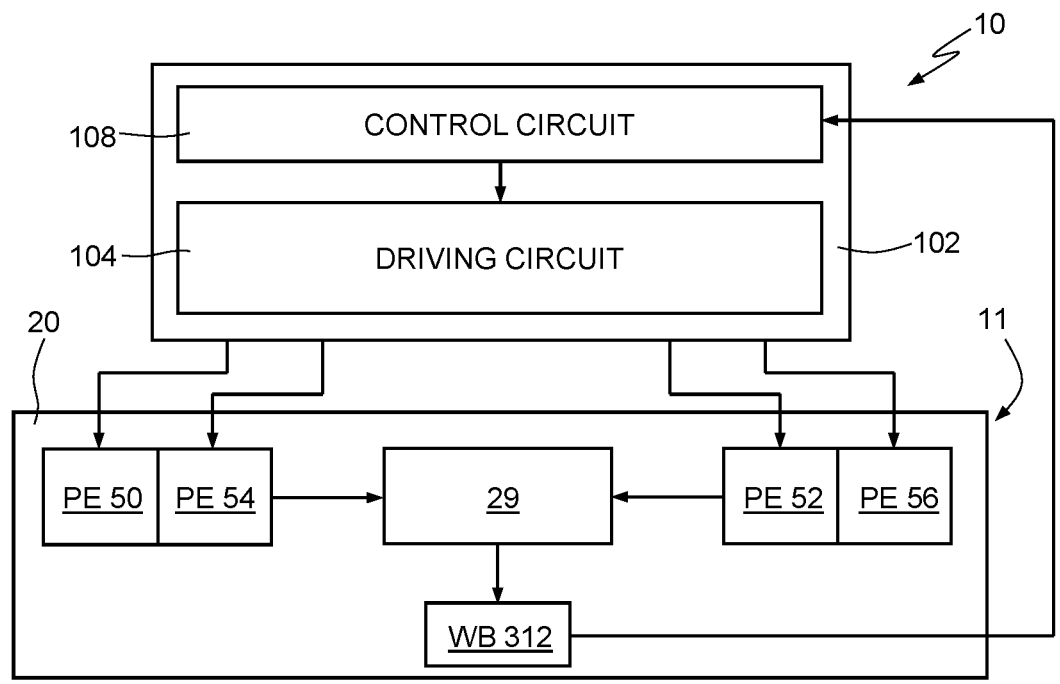
Fig.11

# MEMS DEVICE WITH PIEZOELECTRIC ACTUATION, A PROJECTIVE MEMS SYSTEM INCLUDING THE MEMS DEVICE AND RELATED CONTROL METHOD

PRIORITY CLAIM

This application claims the priority benefit of Italian Application for Patent No. 102016000131849, filed on Dec. 28, 2016, the disclosure of which is hereby incorporated by reference in its entirety to the maximum extent allowable by law.

TECHNICAL FIELD

The present invention relates to a device of the so-called MEMS (Micro-Electro-Mechanical System) type. In particular, the present invention regards a MEMS device with piezoelectric actuation. Further, the present invention regards a projective MEMS system including the MEMS device, and the corresponding control method.

BACKGROUND

As is known, numerous MEMS devices are available today. For example, the so-called MEMS reflectors are known, which include mobile elements formed by mirrors.

In general, a MEMS reflector is designed to receive an optical beam and to vary the direction of propagation thereof, via its own mirror. Typically, the direction of propagation of the optical beam is varied in a periodic or quasi-periodic way so as to carry out scanning of a portion of space with the reflected optical beam.

Further known are MEMS reflectors of a resonant type. In general, a resonant MEMS reflector comprises an actuation system that causes oscillation of the respective mirror in a substantially periodic way around a resting position, the oscillation period being as close as possible to the resonance frequency of the mirror in order to maximize the angular distance covered by the mirror during each oscillation, and thus maximize the size of the portion of space scanned.

In order to improve the resolution with which the optical beam carries out scanning, there is felt the need to provide MEMS reflectors with mirrors having diameters greater than the ones available today, and with resonance frequencies higher than or equal to the ones available today. For this reason, driving systems are required that are able to apply greater forces on the mirrors. In this connection, generally the actuation systems implemented in MEMS reflectors are of an electrostatic or electromagnetic type.

In order to increase the force applied on the mirror, there have been proposed actuation systems of a piezoelectric type, as described for example in U. Baran, "Resonant PZT MEMS Scanner for High-Resolution Displays", Journal of Micro-electro-mechanical Systems, vol. 21, No. 6, pp. 1303-1310, 2012 (incorporated by reference). However, the solutions proposed are characterized by relatively large overall dimensions, and thus by high manufacturing costs.

There is a need to provide a MEMS device with piezoelectric actuation that will solve at least in part the drawbacks of the known art.

SUMMARY

In an embodiment, a MEMS device comprises a fixed structure delimiting a cavity and a suspended structure, which overlies the cavity, and comprises: an internal structure; and at least one first arm and one second arm, which are arranged around the internal structure and each of which has a respective first end and a respective second end, said first ends being fixed to the fixed structure and being angularly arranged at a distance apart, said second ends being fixed to the internal structure, being angularly arranged at a distance apart and being angularly arranged in a same direction of rotation with respect to the corresponding first ends; and a number of piezoelectric actuators, each of which is coupled to the first arm or to the second arm and can be driven so as to cause a deformation of the arm to which it is coupled and a consequent rotation of the internal structure; and wherein, in resting conditions, each of the first and second arms has a respective elongated portion with a respective concavity, said internal structure extending in part within the concavities of the elongated portions of the first and second arms.

BRIEF DESCRIPTION OF THE DRAWINGS

For a better understanding of the present invention, preferred embodiments thereof are now described, purely by way of non-limiting example and with reference to the attached drawings, wherein:

FIG. 9 shows a top plan view of a component of the embodiment shown in FIG. 8;

FIG. 10 shows a circuit diagram formed by components of the embodiment shown in FIG. 8;

FIG. 11 shows a block diagram of a MEMS system that includes the embodiment shown in FIG. 8.

DETAILED DESCRIPTION

The present invention is described in what follows, purely by way of example, with reference to the case of a MEMS device designed to reflect an optical beam in an electronically controllable way, and thus including at least one mirror. However, it is possible that there are other uses of the MEMS device described hereinafter.

Figure 1:
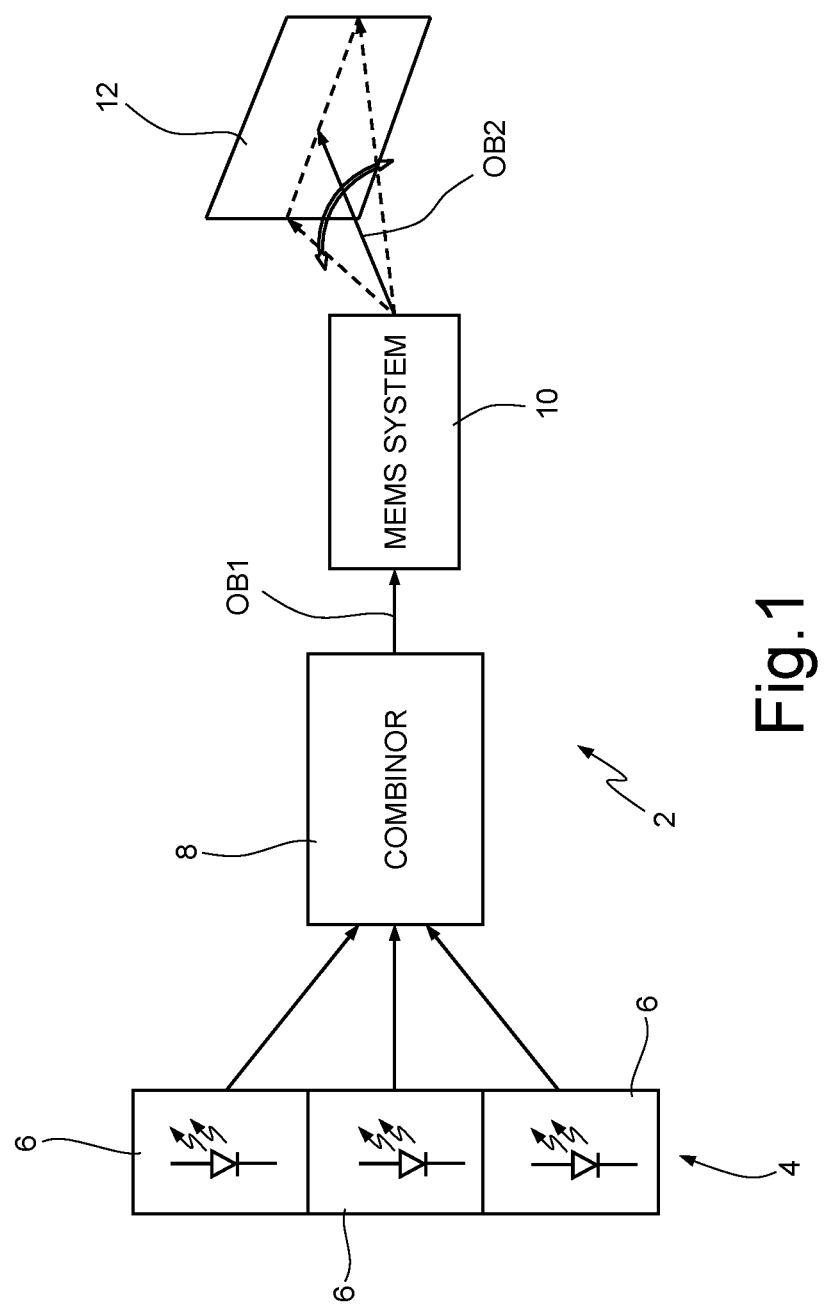
FIG. 1 shows a block diagram of a projective system including the present MEMS device.

This being said, FIG. 1 shows a projective system 2, which includes a light source 4 formed by a plurality of diodes 6 of a laser or LED type, each of which emits electromagnetic radiation at a corresponding wavelength. For example, in FIG. 1 three diodes 6 are shown, each of which emits radiation, respectively, around red (620-750 nm), green (495-570 nm), and blue (450-475 nm).

The projective system 2 further comprises a combiner 8, a MEMS system 10, and a display 12. The combiner 8 is arranged downstream of the light source 4 so as to receive the electromagnetic radiation emitted by the diodes 6 and form a single optical beam OB1, obtained by combination of this electromagnetic radiation. The combiner 8 is further designed to direct the optical beam OB1 on the MEMS system 10. In turn, the MEMS system 10, described in greater detail hereinafter, is designed to generate a reflected optical beam OB2 and to send the reflected optical beam OB2 onto the display 12 so as to enable formation of images on the display 12.

In detail, the MEMS system 10 is designed to vary in time the orientation in space of the axis of the reflected optical beam OB2 so as to scan periodically portions of the display 12.

The MEMS system 10 comprises a MEMS device 11 (shown in FIGS. 2 and 3), which is formed in a first die 20 and includes a fixed supporting body 22 of semiconductor material (for example, silicon), which defines a cavity 24.

The MEMS device 11 further comprises a suspended structure 26, which is constrained, at its own ends, to the fixed supporting body 22 and is suspended over the cavity 24.

The suspended structure 26 comprises a deformable structure 27 and an internal structure 29, which are of semiconductor material.

In detail, the deformable structure 27 comprises a first arm B1 and a second arm B2, which are physically distinct, have elongated shapes, are arranged around the internal structure 29 and in particular extend in cantilever fashion between the fixed supporting body 22 and the internal structure 29. Each of the first and second arms B1, B2 is deformable and functions as spring, this spring being principally subjected to deflection (secondarily, also to torsion), as described hereinafter.

Figure 2:
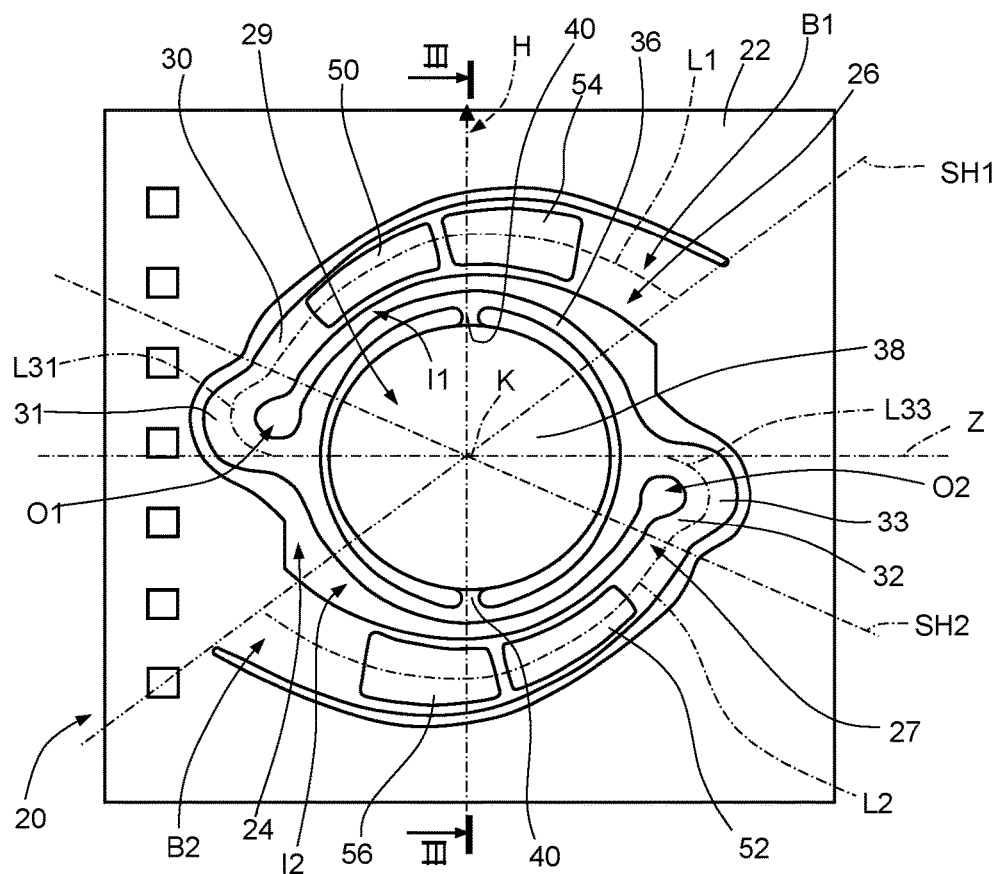
FIG. 2 is a schematic top plan view with portions removed of the present MEMS device.
Figure 3:
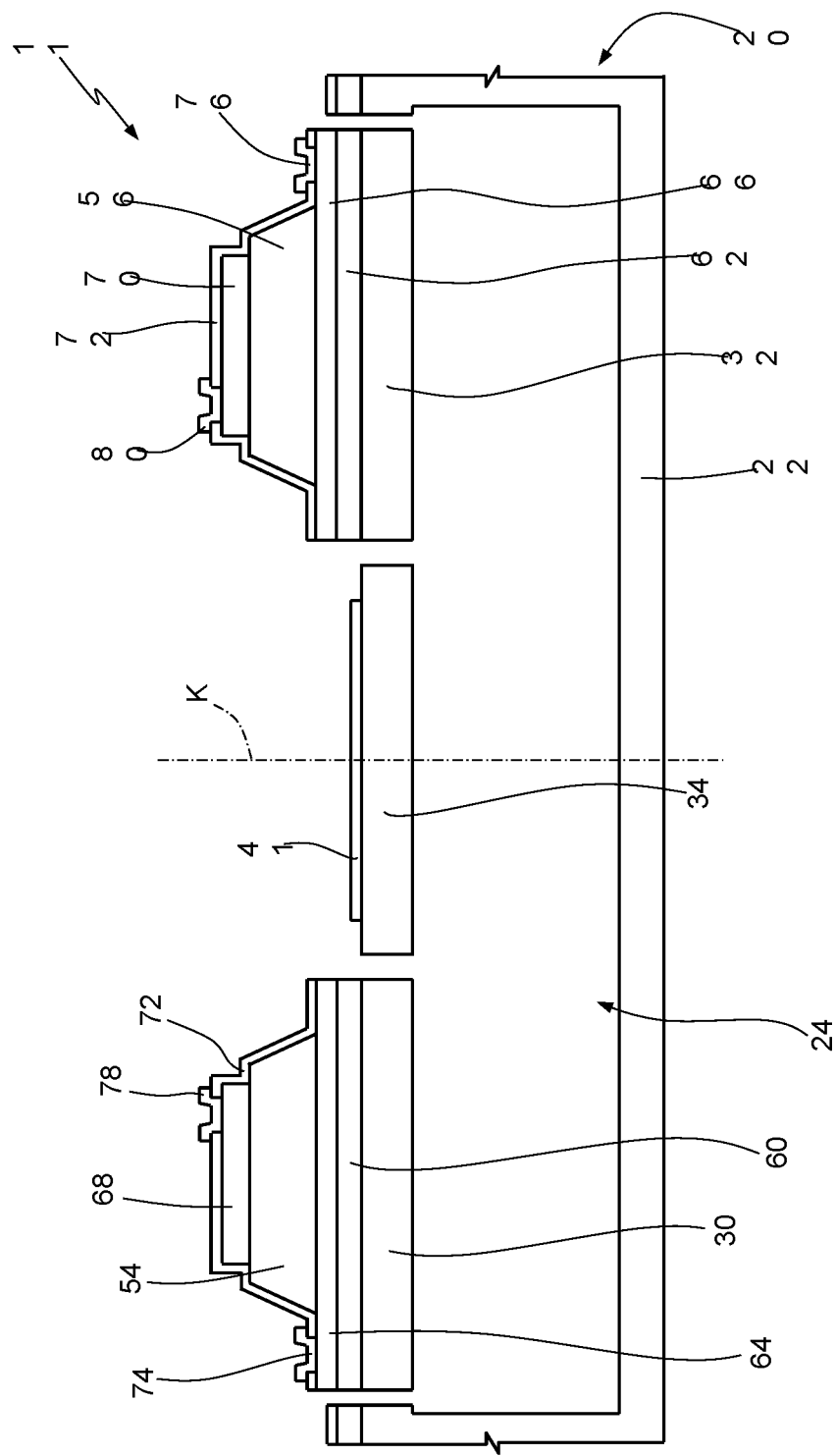
FIG. 3 is a schematic cross-sectional view of a portion of the present MEMS device, taken along a line of section III-III appearing in FIG. 2.

Without any loss of generality, in the embodiment shown in FIGS. 2 and 3, the internal structure 29 comprises a frame-like portion 36, a central portion 38, and two connecting portions 40. In top plan view, the frame-like portion 36 has a ring shape (for example, the shape of an annulus). The central portion 38 extends within the frame-like portion 36, to which it is connected via the two connecting portions 40. The central portion 38 has, for example, a circular shape, in top plan view, and is designed to carry a mirror 41 (shown only in FIG. 3), which is formed, for example, by a metal film and is designed to receive the optical beam OB1 coming from the combiner 8 and to generate the reflected optical beam OB2.

To a first approximation, the central portion 38, the frame-like portion 36, and the two connecting portions 40 form a rigid body. Further, the frame-like portion 36 functions as rotatable frame, as described hereinafter.

In greater detail, in what follows we assume an (oriented) axis H and an axis Z, which are perpendicular to one another and define a plane parallel to the main surface of the first die 20. We further assume a further axis K, perpendicular to the axes H and Z and passing through the geometrical center of the central portion 38 of the internal structure 29. In what follows, the axis K will be referred to as "axis of symmetry K".

This being said, without any loss of generality, the connecting portions 40 extend along the axis H, starting from opposite points of the central portion 38.

As regards the deformable structure 27, in resting conditions the first and second arms B1, B2 extend parallel to the plane HZ. Further, each of them is fixed to the fixed supporting body 22 in a corresponding single area of the latter, as explained in what follows.

In greater detail, each of the first and second arms B1, B2 comprises a respective elongated portion (designated respectively by 30 and 32), which has a curved shape with single concavity, with concavity facing the internal structure 29, and in particular the frame-like portion 36 of the internal structure 29, which is located in a portion of space defined by the concavities of the first and second elongated portions 30, 32, at a distance from the latter, thus without being in contact therewith. In particular, parts of the frame-like portion 36 of the internal structure 29 extend within the recesses formed by the concavities of the first and second elongated portions 30, 32.

Without any loss of generality, in top plan view the first elongated portion 30 extends in a first half-plane defined by the axis Z (i.e., on one side of that axis), whereas the second elongated portion 32 extends in the other half-plane defined by the axis Z (i.e., on the other side of that axis).

Each of the first and second elongated portions 30, 32 has a first end, which is fixed to the fixed supporting body 22. Assuming a cylindrical reference system centered on the axis of symmetry K, the first ends of the first and second elongated portions 30, 32 have a same first radial coordinate, i.e., they are equidistant from the axis of symmetry K, and have angular coordinates that differ by 180° from one another. The first end of the first elongated portion 30 may have an angular coordinate, measured with respect to the axis Z, for example of 30°.

Each of the first and second elongated portions 30, 32 further has a respective second end, which is fixed to the internal structure 29, as described in greater detail hereinafter. Without any loss of generality, the second ends of the first and second elongated portions 30, 32 have a same second radial coordinate, which is less than the first radial coordinate, and have angular coordinates that differ by 180° from one another. Once again without any loss of generality, the second end of the first elongated portion 30 may have an angular coordinate for example of 150°.

In other words, the first ends of the first and second elongated portions 30, 32 are arranged in a plane SH1 in which the axis of symmetry K lies, whereas the second ends of the first and second elongated portions 30, 32 are arranged in a plane SH2, which intersects the plane SH1 along the axis of symmetry K. In addition, mutually opposite portions of the frame-like portion 36 are surrounded laterally, and at a distance, by the first and second elongated portions 30, 32.

In greater detail, each of the first and second elongated portions 30, 32 has an own line of symmetry (designated, respectively, by L1 and L2) of a curved type. In this connection, the previous considerations regarding the coordinates of the ends of each elongated portion may apply to the ends of the corresponding lines of symmetry.

Without any loss of generality, each line of symmetry L1, L2 is formed by a portion of a corresponding spiral (i.e., with radius of curvature that decreases, or at the most is locally constant, as the angular coordinate increases) that winds around the axis of symmetry K, and thus reduces its own distance from the axis of symmetry K as the angular coordinate increases. Further, the lines of symmetry L1, L2 extend on corresponding angular domains, which have amplitudes smaller than 180°, do not overlap, and are respectively equal, for example, to (30°, 150°) and (210°, 330°).

In addition, without any loss of generality, considering each of the first and second elongated portions 30, 32 and denoting as "cross-section", at any point considered of the corresponding line of symmetry, the section in the plane orthogonal to said line of symmetry at the point considered, it is found that the width of the elongated portion, understood as dimension in the plane HZ of the cross-section, decreases as the angular coordinate increases.

Once again without any loss of generality, the first and second elongated portions 30, 32 are the same as one another, are arranged symmetrically (with central symmetry) with respect to the axis of symmetry K, and each one of them can be hypothetically obtained by rototranslation of the other, where the rototranslation includes translations parallel to the plane HZ and rotations about an axis perpendicular to the plane HZ.

As may be seen in FIG. 2, the second ends of the first and second elongated portions 30, 32 connect to corresponding points of the frame-like portion 36 of the internal structure 29, by interposition of corresponding terminal portions.

In particular, the first and second arms B1, B2 comprise, respectively, a first terminal portion 31 and a second terminal portion 33. Further, the second end of the first elongated portion 30 is connected to a first end of the first terminal portion 31, which forms a single piece with the first elongated portion 30. A second end of the first terminal portion 31 is connected to a corresponding point of the frame-like portion 36 of the internal structure 29, which lies along the axis Z.

The second end of the second elongated portion 32 is connected to a first end of the second terminal portion 33, which forms a single piece with the second elongated portion 32. A second end of the second terminal portion 33 is connected to a corresponding point of the frame-like portion 36, which lies along the axis Z and is diametrically opposite with respect to the point of the frame-like portion 36 where the first terminal portion 31 connects up.

Without any loss of generality, the first and second terminal portions 31, 33 are the same as one another and are arranged in a symmetrical way (with central symmetry) with respect to the axis of symmetry K.

In greater detail, and without any loss of generality, each of the first and second terminal portions 31, 33 has an approximately constant width that is approximately equal to the width of the second end of the elongated portion to which it is connected. Further, the respective line of symmetry (designated, respectively, by L31 and L33) is connected to the line of symmetry of the corresponding elongated portion and has an approximately constant radius of curvature smaller than the smallest radius of curvature exhibited by the first (and, equivalently, by the second) line of symmetry L1. Also, the first and second terminal portions 31, 33 each form a corresponding single concavity, the internal structure 29 being arranged on the outside of said concavities.

In addition, the line of symmetry of each of the first and second terminal portions 31, 33 presents a course such as to form a projection that projects radially and externally with respect to the second end of the elongated portion to which it is connected, this projection being angularly staggered by, for example, 15° with respect to said second end.

In other words, if we denote as "first gap I1" the gap delimited by the frame-like portion 36, by the first elongated portion 30, and by the first terminal portion 31, this first gap I1 forms a sort of first eyelet O1, delimited in part by the first terminal portion 31. Further, the first gap I1 includes a respective portion, which is delimited by the first elongated portion 30 and by the frame-like portion 36 and has a width that decreases monotonically as the angular coordinate increases, as far as the second end of the first elongated portion 30, where it connects to the aforementioned eyelet O1. The same considerations apply for a second gap I2, which is delimited by the second elongated portion 32 and which forms a second eyelet O2.

In practice, each one of the first and second terminal portions 31, 33 can hypothetically be obtained by rototranslation of the other, where the rototranslation includes translations parallel to the plane HZ and rotations about an axis perpendicular to the plane HZ.

To a first approximation, the suspended structure 26 thus has the conformation of a spiral galaxy (in top plan view), where the second ends of the arms, fixed to the internal structure 29, are arranged in a same direction of rotation (counter clockwise) with respect to the corresponding first ends of the arms, fixed to the fixed supporting structure 22. This enables reduction of the area of the MEMS device 11, albeit guaranteeing application of a high force of actuation on the internal structure 29, as described hereinafter.

In detail, movement of the rotating element of the internal structure 29 is obtained thanks to the presence of piezoelectric elements. In this connection, the MEMS device 11 comprises a first piezoelectric element 50, a second piezoelectric element 52, a third piezoelectric element 54, and a fourth piezoelectric element 56, which are of piezoelectric material, for example, lead zirconate titanate (PZT) or aluminum nitride (AlN).

The first and third piezoelectric elements 50, 54 are arranged on the first elongated portion 30, whereas the second and fourth piezoelectric elements 52, 56 are arranged on the second elongated portion 32. In this connection, in FIG. 2 portions of the MEMS device 11 have been removed in order to facilitate understanding of the arrangement of the piezoelectric elements. Part of the removed elements is visible in FIG. 3.

In detail, the first and third piezoelectric elements 50, 54 are separate from one another. Further, the first piezoelectric element 50 (from a more quantitative standpoint, its geometrical center) is located at an angular coordinate greater than that of the third piezoelectric element 54 (from a more quantitative standpoint, its geometrical center). In this connection, without any loss of generality, in top plan view and in resting conditions, the first piezoelectric element 50 is entirely located in the left-hand half-plane, with respect to the axis H, whereas the third piezoelectric element 54 has a secondary portion, which is also located in the left-hand half-plane, and a main portion, which is located in the right-hand half-plane.

The second and fourth piezoelectric elements 52, 56 are separate from one another, are respectively the same as the first and third piezoelectric elements 50, 54 and are arranged in a way symmetrical, with respect to the axis of symmetry K, to the first and third piezoelectric elements 50, 54, respectively. Consequently, the second piezoelectric element 52 is located at a greater angular coordinate than the fourth piezoelectric element 56. Further, in top plan view and in resting conditions, the second piezoelectric element 52 is located entirely in the right-hand half-plane, with respect to the axis H, whereas the fourth piezoelectric element 56 has a secondary portion, which is also located in the right-hand half-plane, and a main portion, which is located in the left-hand half-plane.

In greater detail, as visible in FIG. 3, the MEMS device 11 comprises a first dielectric region 60 and a second dielectric region 62, which extend, respectively, over the first and second elongated portions 30, 32, with which they are in direct contact, and are made, for example, of silicon oxide.

Further, the MEMS device 11 comprises a first bottom electrode 64 and a second bottom electrode 66, which are made, for example, of titanium and extend respectively over the first and second dielectric regions 60, 62, with which they are in direct contact. In turn, the first and third piezoelectric elements 50, 54 are arranged on the first bottom electrode 64, with which they are in direct contact, whereas the second and fourth piezoelectric elements 52, 56 are arranged on the second bottom electrode 66, with which they are in direct contact.

The MEMS device 11 further comprises, for each piezoelectric element, a respective top electrode, made, for example, of platinum and overlying, in direct contact, the respective piezoelectric element. In this connection, in FIG. 3 a first top electrode 68 and a second top electrode 70 are visible, which are arranged respectively on the third and fourth piezoelectric elements 54, 56.

The MEMS device 11 further comprises a dielectric coating 72, which extends over the top electrodes, as well as over the exposed portions of the piezoelectric elements and of the bottom electrodes. In order to enable the electrical contacts with the first and second bottom electrodes 64, 66, the MEMS device 11 comprises a first bottom-electrode metallization 74 and a second bottom-electrode metallization 76, which extend through the dielectric coating 72 and contact the first and second bottom electrodes 64, 66, respectively. Likewise, the MEMS device 11 comprises, for each top electrode, a corresponding top-electrode metallization. In this connection, in FIG. 3 a first top-electrode metallization 78 and a second top-electrode metallization 80 are visible, which extend through the dielectric coating 72 and contact, respectively, the first and second top electrodes 68, 70.

Figure 4:
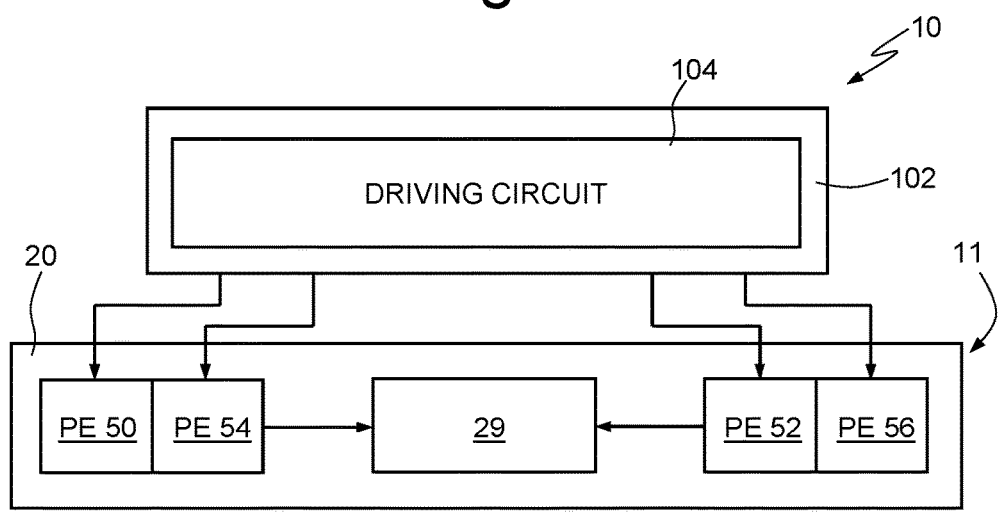
FIG. 4 shows a block diagram of a MEMS system that includes the present MEMS device.

As shown in FIG. 4, the MEMS system 10 further comprises a second die 102, formed inside which is a driving circuit 104, which is electrically connected to the first, second, third, and fourth piezoelectric (PE) elements 50, 52, 54, 56 and is designed to bias the latter, through the top-electrode metallizations and the bottom-electrode metallizations.

Figure 5:
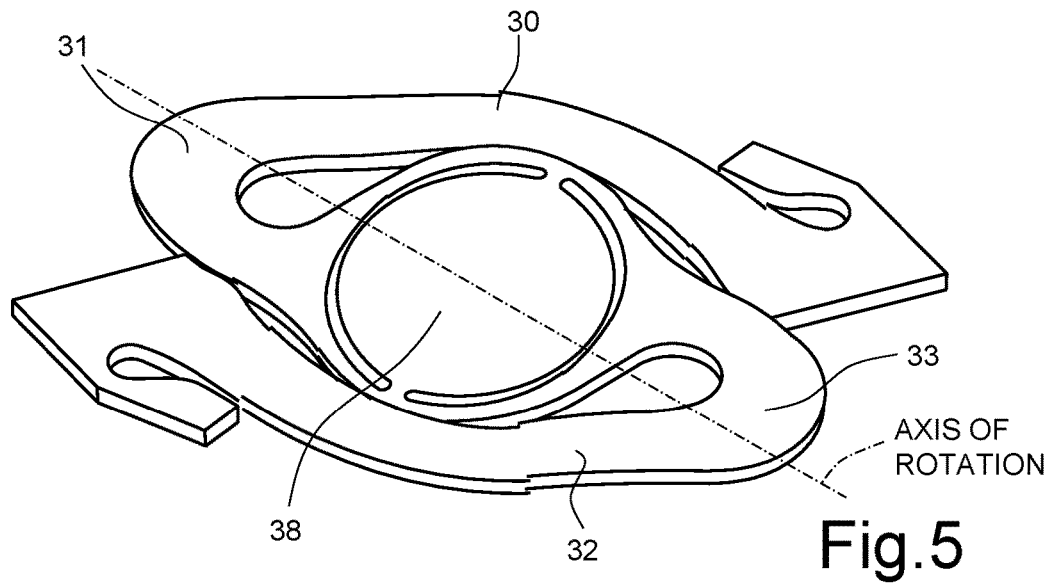
FIG. 5 is a schematic perspective view of a part of the present MEMS device, when subjected to a deformation provided by way of example.

In use, the driving circuit 104 applies on the first and fourth piezoelectric elements 50, 56 a first control signal, of an a.c. type, and further applies on the second and third piezoelectric elements 52, 54 a second control signal, which is also of an alternating current (a.c.) type and is phase-shifted by 180° with respect to the first control signal. In this way, it may be shown that the deformable structure 27 undergoes a periodic deformation, such as to cause a rotation of the internal structure 29, and in particular of its central portion 38, about a first axis of rotation that lies in the plane HZ and is comprised between the axes H and Z. An example of the deformation undergone by the deformable structure 27 at a given instant is shown in FIG. 5. In general, the exact position of the first axis of rotation depends upon the angular arrangement of the first ends of the first and second elongated portions 30, 32 and of the points of contact of the terminal portions 31, 33 with the frame-like portion 36.

In greater detail, the internal structure 29, in so far as it is a mechanical structure, exhibits a certain number of modes of oscillation, which on the other hand can be studied analytically and/or experimentally and/or numerically. Further, it may be shown that the first, second, third, and fourth piezoelectric elements 50, 52, 54, and 56 are arranged on the portions of the first and second elongated portions 30, 32 that, considering the operating mode (i.e., the mode of oscillation that envisages oscillation about the aforesaid first axis of rotation), are subject to greater deviations (in absolute value) with respect to the corresponding resting positions. In what follows, these portions will be denoted also as "intermediate portions". In this way, given the same amplitude of the rotation of the internal structure 29, and thus of the mirror 41, the energy supplied to the piezoelectric elements to obtain this rotation is reduced, thus optimizing consumption.

Figure 6:
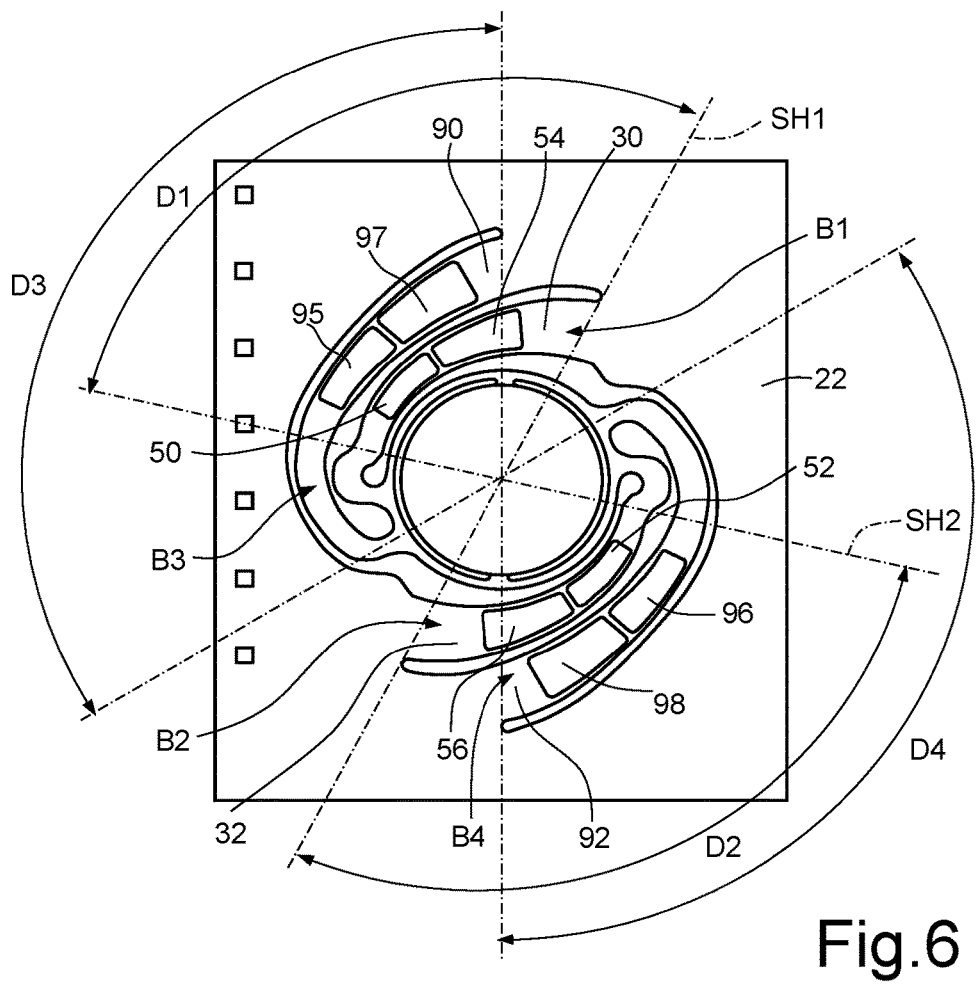
FIG. 6 is a schematic top plan view with portions removed of a further embodiment of the present MEMS device.

According to a different embodiment, shown in FIG. 6, the deformable structure 27 of the MEMS device 11 comprises a third arm B3 and a fourth arm B4, which in turn comprise, respectively, a third elongated portion 90 and a fourth elongated portion 92.

In detail, in FIG. 6 the angular domains of the first and second elongated portions 30, 32 are designated by D1 and D2. Further, FIG. 6 shows the angular domains of the third and fourth elongated portions 90, 92, which are designated, respectively, by D3 and D4. The angular domains of the complete arms are not indicated, but may be derived from the angular domains of the corresponding elongated portions and are given, for each of the arms, by the difference between the angular coordinates of the second end of the corresponding terminal portion and of the first end of the corresponding elongated portion.

In greater detail, the third and fourth elongated portions 90, 92 are arranged on the outside of the first and second elongated portions 30, 32 and have curved shapes, with individual concavities facing, respectively, the first and second elongated portions 30, 32. Parts of the first and second elongated portions 30, 32 extend, respectively, within the recesses formed by the concavities of the third and fourth elongated portions 90, 92.

Each of the third and fourth elongated portions 90, 92 has a first end, which is fixed to the fixed supporting body 22. Without any loss of generality, the first ends of the third and fourth elongated portions 90, 92 have a same radial coordinate (greater than the radial coordinate of the first ends of the first and second elongated portions 30, 32) and have angular coordinates that differ by 180° from one another. Once again without any loss of generality, the first end of the third elongated portion 90 has an angular coordinate comprised between the angular coordinates of the first and second ends of the first elongated portion 30, whereas the first end of the fourth elongated portion 92 has an angular coordinate comprised between the angular coordinates of the first and second ends of the second elongated portion 32.

Each of the third and fourth elongated portions 90, 92 further has a respective second end, which is fixed to the internal structure 29, as described in greater detail hereinafter. Without any loss of generality, the second ends of the third and fourth elongated portions 90, 92 have a same second radial coordinate, which is smaller than the radial coordinate of the corresponding first ends and have angular coordinates that differ by 180° from one another. Once again without any loss of generality, the second end of the third elongated portion 90 has an angular coordinate comprised between the angular coordinates of the second end of the first elongated portion 30 and of the first end of the second elongated portion 32, whereas the second end of the fourth elongated portion 92 has an angular coordinate comprised between the angular coordinates of the second end of the second elongated portion 32 and of the first end of the first elongated portion 30.

In practice, the angular domains of the third and fourth arms B3, B4 overlap respectively, for at least 50%, the angular domains of the first and second arms B1, B2.

In greater detail, each of the third and fourth elongated portions 90, 92 has an own line of symmetry (not shown, but like that shown in FIG. 2) of a curved type, which reduces its own distance from the axis of symmetry K as the angular coordinate increases. Further, the lines of symmetry of the third and fourth elongated portions 90, 92 extend on corresponding angular domains, which have an amplitude smaller than 180° and do not overlap. Without any loss of generality, considering each of the third and fourth elongated portions 90, 92, the width of the elongated portion decreases as the angular coordinate increases.

Once again without any loss of generality, the third and fourth elongated portions 90, 92 are the same as one another and are arranged in a symmetrical way with respect to the axis of symmetry K.

The second ends of the third and fourth elongated portions 90, 92 connect to corresponding points of the frame-like portion 36 of the internal structure 29, by interposition of corresponding terminal portions (not indicated), which are angularly arranged at a distance apart by 180°.

The MEMS device 11 further comprises a fifth piezoelectric element 95, a sixth piezoelectric element 96, a seventh piezoelectric element 97, and an eighth piezoelectric element 95, 96, 97, 98.

The fifth and seventh piezoelectric elements 95, 97 are arranged on the third elongated portion 90, whereas the sixth and eighth piezoelectric elements 96, 98 are arranged on the fourth elongated portion 92. Further, the fifth and eighth piezoelectric elements 95, 98 are driven with the first control signal, whereas the sixth and seventh piezoelectric elements 96, 97 are driven with the second control signal.

In practice, the embodiment shown in FIG. 6 makes it possible to exert a greater force on the internal structure 29, as well as to increase the frequency of rotation, thanks to the presence of a number of deformable elements that operate in parallel. In this connection, albeit not shown, embodiments are in any case possible with an even greater number of arms and/or piezoelectric elements.

Figure 7:
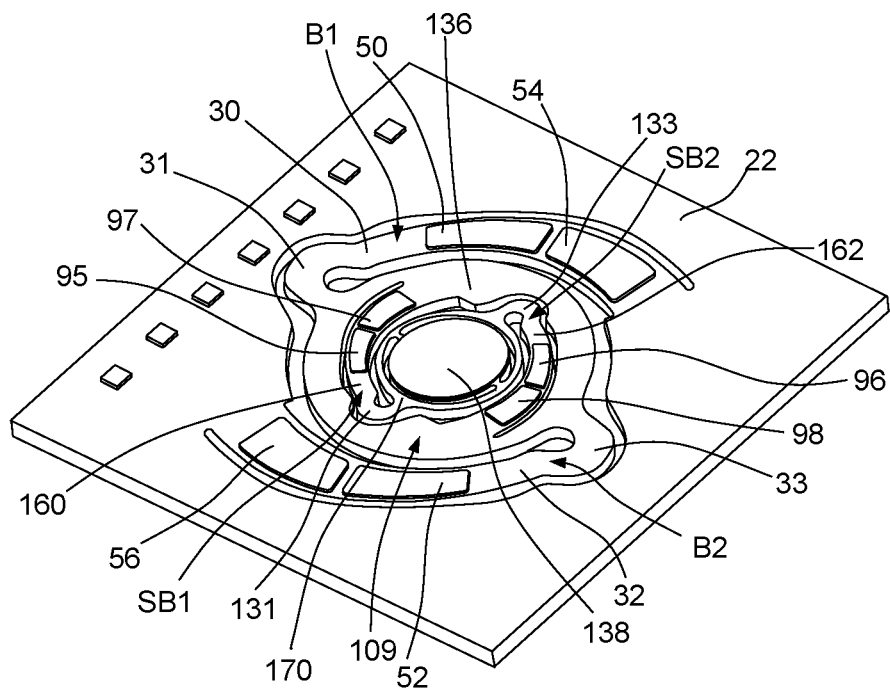
FIG. 7 is a schematic perspective view with portions removed of a further embodiment of the present MEMS device.

According to a different embodiment, shown in FIG. 7, the internal structure (here designated by 109) again comprises the frame-like portion (of a hollow type), here designated by 136, which will be referred to in what follows as "outer frame 136".

Extending within the cavity defined by the outer frame 136 are: a further deformable structure including a pair further arms, which will be referred to in what follows as first and second secondary arms SB1, SB2; an inner frame 170; and a supporting portion 138, designed to carry the mirror 41 (not shown in FIG. 7). The first and second secondary arms SB1, SB2 comprise, respectively, a first secondary elongated portion 160 and a second secondary elongated portion 162, as well as, respectively, a first secondary terminal portion 131 and a second secondary terminal portion 133.

In greater detail, the supporting portion 138 connects up to the inner frame 170 by connecting portions (not associated to reference numbers in FIG. 7), in a way similar to what has been described as regards the frame-like portion 36 and the central portion 38.

The first and second secondary elongated portions 160, 162 are deformable and function as springs.

In greater detail, each of the first and second secondary elongated portions 160, 162 has a curved shape with single concavity, with concavity facing the inner frame 170, which is located in a portion of space defined by the concavities of the first and second secondary elongated portions 160, 162. In particular, the inner frame 170 has an annular shape, with circular outer perimeter, in top plan view. Further, parts of the inner frame 170 extend within the recesses formed by the concavities of the first and second secondary elongated portions 160, 162.

Each of the first and second secondary elongated portions 160, 162 has a first end, which is fixed to the outer frame 136. Without any loss of generality, the first ends of the first and second secondary elongated portions 160, 162 have a same radial coordinate and have angular coordinates that differ by 180° from one another. Further, the first ends of the first and second secondary elongated portions 160, 162 have angular coordinates that are arranged at a distance, for example, of 90° (in the counter clockwise direction), from the first ends, respectively, of the first and second elongated portions 30, 32 (in this embodiment, the latter have angular coordinates approximately equal to 60° and 240°).

Each of the first and second secondary elongated portions 160, 162 further has a respective second end, which is fixed to the inner frame 170, as described in greater detail hereinafter. Without any loss of generality, the second ends of the first and second secondary elongated portions 160, 162 have a same second radial coordinate, which is less than the radial coordinate of the corresponding first ends, and have angular coordinates that differ by 180° from one another.

In greater detail, each of the first and second secondary elongated portions 160, 162 has an own line of symmetry of a curved type, which, without any loss of generality, is formed by a portion of a corresponding spiral. Further, the second ends of the first and second secondary elongated portions 160, 162 connect to the inner frame 170, respectively, by interposition of the first and second secondary terminal portions 131, 133. In turn, the first and second secondary terminal portions 131, 133 are fixed in corresponding points of the inner frame 170, which are angularly arranged at a distance apart from one another by 180° and further angularly staggered by 90° with respect to the points in which the first and second terminal portions 31, 33 connect to the outer frame 136.

As regards the shape of the first and second secondary terminal portions 131, 133, there apply the same considerations expressed in regard to the first and second terminal portions 31, 33, in particular as regards the width, the radius of curvature, and the projecting course of the respective lines of symmetry.

In the embodiment shown in FIG. 7, the MEMS device 11 also comprises the fifth, sixth, seventh, and eighth piezoelectric elements 95, 96, 97, 98.

The fifth and seventh piezoelectric elements 95, 97 are arranged on the first secondary elongated portion 160, whereas the sixth and eighth piezoelectric elements 96, 98 are arranged on the second secondary elongated portion 162. In particular, as regards the arrangement of the fifth, sixth, seventh, and eighth piezoelectric elements 95, 96, 97, 98 on the first and second secondary elongated portions 160, 162, there apply the same considerations expressed in regard to the first, second, third, and fourth piezoelectric elements 50, 52, 54 and 56, in particular as regards the arrangement on portions with greater deviation (with respect to the resting conditions) of the first and second secondary elongated portions 160, 162.

The fifth and eighth piezoelectric elements 95, 98 are driven by a third control signal, whereas the sixth and seventh piezoelectric elements 96, 97 are driven by a fourth control signal.

The third and fourth control signals are of an a.c. type and can be generated by the driving circuit 104, so as to be phase-shifted with respect to one another by 180°. Further, the third and fourth control signals may have a frequency and/or amplitude different from the first and second control signals.

In practice, the first and second elongated portions 30, 32 and the corresponding piezoelectric elements form a first pair of actuators, whereas the first and second secondary elongated portions 160, 162 form a second pair of actuators, nested with respect to the first pair of actuators and arranged orthogonally (i.e., rotated through 90°) with respect to the latter; however possible are embodiments (not shown) in which the arrangement of the pairs of actuators is not orthogonal.

Once again with reference to the embodiment shown in FIG. 7, without any loss of generality, the first and second secondary elongated portions 160, 162 may be the same as the first and second elongated portions 30, 32, but for a scale factor.

Operatively, the first, second, third, and fourth piezoelectric elements 50, 52, 54, 56 are actuators that enable deformation of the first and second elongated portions 30, 32, and consequently rotation of the outer frame 136 about the aforementioned first axis of rotation, with respect to the fixed supporting body 22. Further, the fifth, sixth, seventh, and eighth piezoelectric elements 95, 96, 97, 98 are actuators that enable deformation of the first and second secondary elongated portions 160, 162, and consequently rotation of the inner frame 170 about a second axis of rotation (not shown), which is perpendicular to the first axis of rotation and lies in the plane HZ (strictly speaking, this applies to the case of absence of deformations). Rotation of the inner frame 170 entails simultaneous rotation of the supporting portion 138, which forms substantially a rigid body with the inner frame 170.

It follows that, with respect to the fixed supporting body 22, the supporting portion 138, which carries the mirror 41, can turn about two axes orthogonal to one another. In this case, the projective system 2 is of a biaxial type.

Figure 8:
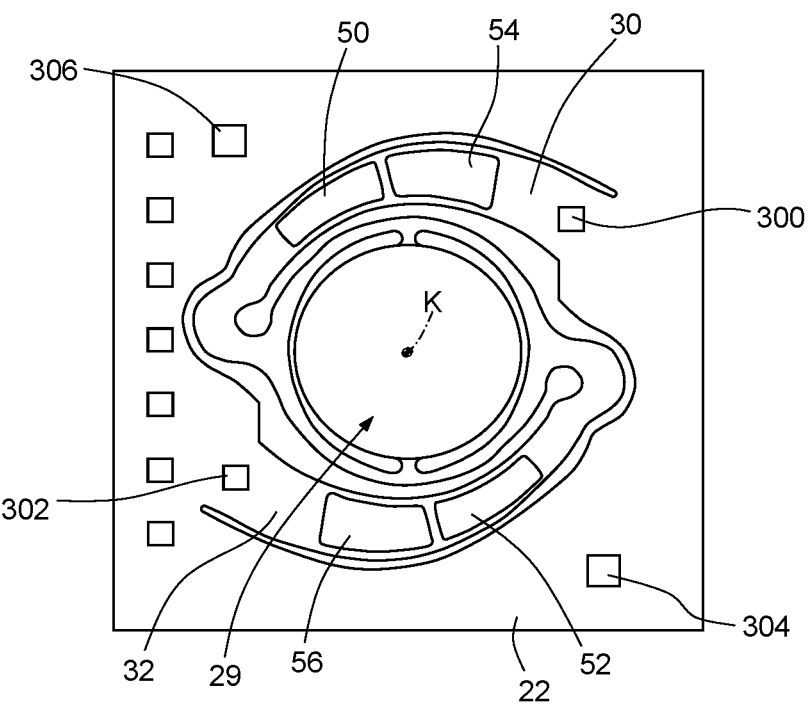
FIG. 8 is a schematic top plan view with portions removed of a further embodiment of the present MEMS device.

In general, all the embodiments described may include one or more strain gauges, as shown in FIG. 8 with reference, purely by way of example, to the embodiment shown in FIG. 2.

In detail, the MEMS device 11 comprises a first strain gauge 300, a second strain gauge 302, a third strain gauge 304, and a fourth strain gauge 306, each of which is formed, for example, by a metal serpentine 310 (made, for example, of platinum), shown in FIG. 9. The serpentine may be formed during the process flow of the MEMS device 11, for example during the steps of formation of the electrodes.

Once again with reference to FIG. 8, the first and second strain gauges 300, 302 are arranged, respectively, on the first end of the first elongated portion 30 and on the first end of the second elongated portion 32, in a symmetrical way (with central symmetry) with respect to the axis of symmetry K. The third and fourth strain gauges 304, 306 are instead arranged on the fixed supporting body 22, in a symmetrical way (with central symmetry) with respect to the axis of symmetry K.

The MEMS device 11 further comprises conductive paths (not shown), which connect the strain gauges so that they form a Wheatstone bridge 312, shown in FIG. 10, where the strain gauges are modelled as equivalent resistors.

In detail, a first terminal and a second terminal of the first strain gauge 300 form, respectively, a node N1 and a node N2. A first terminal of the second strain gauge 302 is connected to the node N1, whereas the second terminal forms a node N3. A first terminal of the third strain gauge 304 is connected to the node N3, whereas the second terminal forms a node N4. The first and second terminals of the fourth strain gauge 306 are connected, respectively, to the node N2 and to the node N4.

In practice, the third and fourth strain gauges 304, 306 function as reference resistors, because the respective resistances do not depend upon the angular position of the internal structure 29. Instead, the resistances of the first and second strain gauges 300, 302 are the same as one another in the absence of rotation of the internal structure 29, whereas, when the internal structure 29 rotates, they undergo deviations that are the same in modulus, but have opposite signs, these deviations being proportional to the degree of the rotation. This occurs because the first and second strain gauges 300, 302 are arranged on symmetrical portions of elongated portions, which, when the deformable structure 27 undergoes deformation, are subjected to out-of-plane displacements with approximately the same amplitude, but opposite signs. These symmetrical portions thus exert on the strain gauges opposite tensile stresses of approximately the same intensity.

As shown in FIG. 11, in the second die 102 there may be formed, in addition to the driving circuit 104, a control circuit 108, which is electrically coupled to the Wheatstone bridge (WB) 312 and to the driving circuit 104.

In detail, the control circuit 108 is configured to generate a signal indicating the angular position of the internal structure 29, as a function of the resistances of the Wheatstone bridge 312. Further, the control circuit 108 controls the driving circuit 104 as a function of the signal indicating the angular position; i.e., it controls the first and second control signals so as to optimize the driving in frequency and amplitude, i.e., so as to obtain the desired angular deflection.

Figure 12:
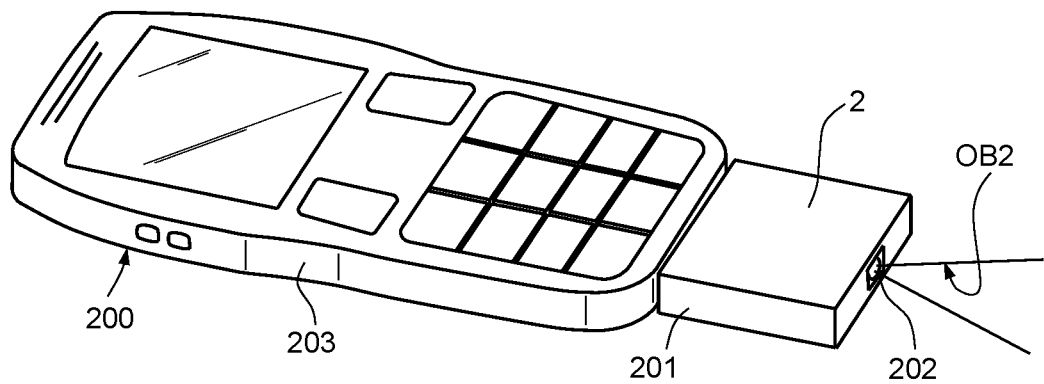
FIGS. 12 and 13 are schematic perspective views of portable apparatuses that incorporate the present projective system.

As illustrated in FIG. 12, the projective system 2 may be obtained as separate and stand-alone accessory with respect to an associated portable electronic apparatus 200, such as a cellphone or smartphone (or else, for example, a PDA, a tablet, a digital audio player, or a controller for videogames), being coupled to a same portable electronic apparatus 200 by appropriate electrical and mechanical connection elements (not illustrated). In this case, the projective system 2 is provided with an own package 201, which has at least one portion 202 transparent to the reflected optical beam OB2 generated by the MEMS reflector 8. The package 201 of the projective system 2 is releasably coupled to a respective case 203 of the portable electronic apparatus 200.

Figure 13:
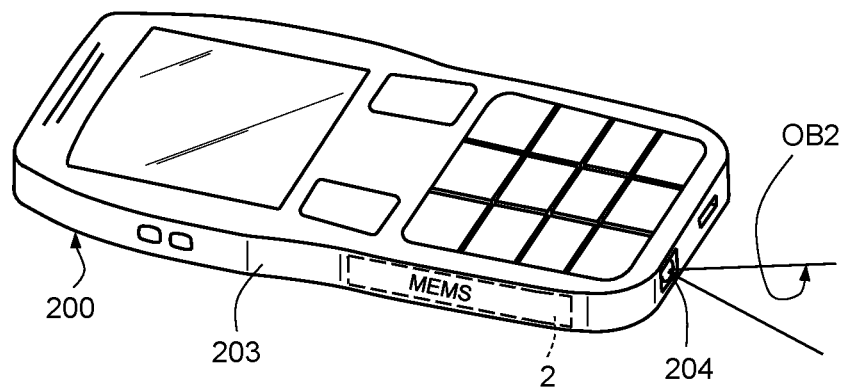

Alternatively, as illustrated in FIG. 13, the projective system 2 may be integrated within the portable electronic apparatus 200, being arranged within the case 203 of the portable electronic apparatus 200 itself, which has in this case a respective portion 204 transparent to the reflected optical beam OB2 generated by the MEMS reflector 8. In this case, the projective system 2 is, for example, coupled to a printed-circuit board present within the case 203 of the portable electronic apparatus 200.

From what has been described and illustrated previously, the advantages that the present solution affords emerge clearly.

In particular, the present MEMS device is characterized by reduced overall dimensions, thanks to the fact that the deformable arms that carry the actuators, i.e., the piezoelectric elements, form concavities that house part of the internal structures.

In conclusion, it is clear that modifications and variations may be made to what has been described and illustrated herein, without thereby departing from the scope of the present invention, as defined in the annexed claims.

For example, the terminal portions of the arms may have shapes different from what has been described.

As regards the elongated portions of the arms, they may extend on angular domains different from what has been illustrated.

In general, the angular domains of the first and second elongated portions have amplitudes comprised in the interval (60°, 170°), or else in the interval (90°, 150°), as also the angular domains of the first and second secondary elongated portions, if present. Further, the elongated portions of the arms may have more than one concavity and/or convex regions facing the internal structure. In general, the course of the lines of symmetry of the arms may thus be more irregular than what has been described, as likewise the angular arrangements of the respective ends. Further, the arms have angular domains with amplitudes comprised in the interval (65°, 175°), or else in the interval (95°, 155°). In addition, the angular domains of the first and second arms B1, B2 are preferably disjoint so that the area occupied by the MEMS device 11 is particularly reduced. Similar considerations apply for the pairs formed by the third and fourth arms B3, B4 and by the first and second secondary arms SB1, SB2, if present.

As regards the internal structure 29, the frame-like portion 36 may be of a full type, instead of being hollow, in which case it functions as central portion 38 and carries the mirror 41, the connecting portions 40 being absent. Likewise, the inner frame 170 may be replaced by a full structure, which functions as supporting portion 138 and carries the mirror 41.

As regards the number of piezoelectric elements coupled to each arm, it may differ from the one described. For example, on each arm there may be present just one piezoelectric element, which has a shape different from that of the piezoelectric element present on the other arm.

As regards the central portion 38 and the supporting portion 138, they may have shapes different from what has been described; for example, they may include shapings designed to increase stiffness.

Finally, the present device may be obtained using one or more metal materials (e.g., aluminum or steel) instead of semiconductor material.

The invention claimed is:

1. A MEMS device, comprising:
a fixed structure delimiting a cavity;
a suspended structure which overlies the cavity, the suspended structure comprising:
an internal structure; and
a first arm and a second arm which are arranged around the internal structure and each of the first and second arms having a respective first end and a respective second end, said first ends being fixed to the fixed structure and being angularly arranged at a distance apart, said second ends being fixed to the internal structure and being angularly arranged at a distance apart and being angularly arranged in a same direction of rotation with respect to the corresponding first ends;
wherein the first arm has a first length and a first width, with the first length being greater than the first width, and wherein the first and second ends of the first arm are located at opposite ends of the first arm and separated by the first length in its entirety;
wherein the second arm has a second length and a second width, with the second length being greater than the second width, and wherein the first and second ends of the second arm are located at opposite ends of the second arm and separated by the second length in its entirety; and
wherein, in a resting condition, each of the first and second arms has a respective elongated portion with a respective concavity, said internal structure extending in part within the concavities of the elongated portions of the first and second arms; and
a plurality of piezoelectric actuators coupled to the first arm and the second arm and configured when driven to cause a deformation of the arm to which the piezoelectric actuator is coupled and a consequent rotation of the internal structure.

2. The MEMS device according to claim 1, wherein, in the resting condition, said first and second arms extend around the internal structure on angular domains at least in part shifted and extending over an interval from about 65° to about 175°.

3. The MEMS device according to claim 2, wherein the angular domains of the first and second arms are disjointed.

4. The MEMS device according to claim 1, wherein the second ends of the first and second arms are arranged at an angular distance of 180°.

5. The MEMS device according to claim 1, wherein the first ends of the first and second arms are arranged at an angular distance of 180°.

6. The MEMS device according to claim 1, wherein, in the resting condition, the elongated portions of the first and second arms each form a single concavity.

7. The MEMS device according to claim 6, wherein each of the first and second elongated portions has a respective line of symmetry having a radius of curvature that varies angularly in a monotonic way.

8. The MEMS device according to claim 7, wherein a width of each of the first and second elongated portions decreases along a length of the line of symmetry from the first end to the second end.

9. The MEMS device according to claim 1, wherein each of said piezoelectric actuators is arranged on the elongated portion of the arm to which it is coupled.

10. The MEMS device according to claim 1, wherein said fixed structure and said internal structure are made at least in part of semiconductor material.

11. A projective MEMS system, comprising:
a MEMS device according to claim 1;
a reflecting element coupled to the internal structure; and
an optical source configured to generate an optical beam that impinges on the reflecting element.

12. A portable electronic apparatus, comprising:
a projective MEMS system according to claim 11.

13. The apparatus according to claim 12, wherein said projective MEMS system is a stand-alone accessory having a package releasably coupled to a respective case of said portable electronic apparatus.

14. The apparatus according to claim 12, wherein said projective MEMS system is formed in an integrated way within a case of said portable electronic apparatus.

15. A The MEMS device, comprising:
a fixed structure delimiting a cavity;
a suspended structure which overlies the cavity, the suspended structure comprising:
an internal structure; and
a first arm and a second arm which are arranged around the internal structure and each of the first and second arms having a respective first end and a respective second end, said first ends being fixed to the fixed structure and being angularly arranged at a distance apart, said second ends being fixed to the internal structure and being angularly arranged at a distance apart and being angularly arranged in a same direction of rotation with respect to the corresponding first ends;
wherein, in a resting condition, the first and second arms respectively have first and second elongated portions having respective single concavities, said internal structure extending in part within the concavities of the first and second elongated portions; and
a plurality of piezoelectric actuators coupled to the first arm and the second arm and configured when driven to cause a deformation of the arm to which the piezoelectric actuator is coupled and a consequent rotation of the internal structure;
wherein the first and second elongated portions form, respectively, the first ends of the first and second arms;
wherein the first and second arms further comprise, respectively, a first terminal portion and a second terminal portion, which form, respectively, the second ends of the first and second arms; and
wherein the first and second terminal portions connect, respectively, to corresponding parts of the first and second elongated portions and form curved projections with single concavity, with concavity facing the internal structure, said curved projections projecting radially with respect to said parts of the first and second elongated portions.

16. The MEMS device according to claim 15, wherein each of the first and second elongated portions has a respective line of symmetry having a radius of curvature that varies angularly in a monotonic way.

17. The MEMS device according to claim 16, wherein a width of each of the first and second elongated portions decreases along a length of the line of symmetry from the first end to the second end.

18. The MEMS device according to claim 15, wherein, in the resting condition, said first and second arms extend around the internal structure on angular domains at least in part shifted and extending over an interval from about 65° to about 175°.

19. The MEMS device according to claim 18, wherein the angular domains of the first and second arms are disjointed.

20. The MEMS device according to claim 15, wherein the second ends of the first and second arms are arranged at an angular distance of 180°.

21. The MEMS device according to claim 15, wherein the first ends of the first and second arms are arranged at an angular distance of 180°.

22. A MEMS device, comprising:
a fixed structure delimiting a cavity;
a suspended structure which overlies the cavity, the suspended structure comprising:
an internal structure; and
a first arm and a second arm which are arranged around the internal structure and each of the first and second arms having a respective first end and a respective second end, said first ends being fixed to the fixed structure and being angularly arranged at a distance apart, said second ends being fixed to the internal structure and being angularly arranged at a distance apart and being angularly arranged in a same direction of rotation with respect to the corresponding first ends;
wherein, in a resting condition, each of the first and second arms has a respective elongated portion with a respective concavity, said internal structure extending in part within the concavities of the elongated portions of the first and second arms; and
a plurality of piezoelectric actuators coupled to the first arm and the second arm and configured when driven to cause a deformation of the arm to which the piezoelectric actuator is coupled and a consequent rotation of the internal structure;
wherein each of said piezoelectric actuators is arranged on the elongated portion of the arm to which it is coupled; and
wherein the plurality of piezoelectric actuators comprises a first piezoelectric actuator, a second piezoelectric actuator, a third piezoelectric actuator, and a fourth piezoelectric actuator, the first and third piezoelectric actuators being arranged on the elongated portion of the first arm, the second and fourth piezoelectric actuators being arranged on the elongated portion of the second arm, in a way symmetrical, respectively, to the first and second piezoelectric actuators.

23. The MEMS device according to claim 22, further comprising a drive circuit configured to apply to the first and fourth piezoelectric actuators a first control signal and to apply to the second and third piezoelectric actuators a second control signal, wherein the second control signal is phase-shifted by 180° with respect to the first control signal.

24. The MEMS device according to claim 22, wherein, in the resting condition, said first and second arms extend around the internal structure on angular domains at least in part shifted and extending over an interval from about 65° to about 175°.

25. The MEMS device according to claim 24, wherein the angular domains of the first and second arms are disjointed.

26. The MEMS device according to claim 22, wherein the second ends of the first and second arms are arranged at an angular distance of 180°.

27. The MEMS device according to claim 22, wherein the first ends of the first and second arms are arranged at an angular distance of 180°.

28. A MEMS device, comprising:
a fixed structure delimiting a cavity;
a suspended structure which overlies the cavity, the suspended structure comprising:
an internal structure; and
a first arm and a second arm which are arranged around the internal structure and each of the first and second arms having a respective first end and a respective second end, said first ends being fixed to the fixed structure and being angularly arranged at a distance apart, said second ends being fixed to the internal structure and being angularly arranged at a distance apart and being angularly arranged in a same direction of rotation with respect to the corresponding first ends;
wherein, in a resting condition, each of the first and second arms has a respective elongated portion with a respective concavity, said internal structure extending in part within the concavities of the elongated portions of the first and second arms;
a plurality of piezoelectric actuators coupled to the first arm and the second arm and configured when driven to cause a deformation of the arm to which the piezoelectric actuator is coupled and a consequent rotation of the internal structure; and
a third arm and a fourth arm, each of third and fourth arms comprising a respective elongated portion having a concavity; and wherein, in the resting condition, the elongated portions of the first and second arms extend at least in part within the concavities formed, respectively, by the elongated portions of the third and fourth arms.

29. The MEMS device according to claim 28, wherein, in the resting condition, said first and second arms extend around the internal structure on angular domains at least in part shifted and extending over an interval from about 65° to about 175°.

30. The MEMS device according to claim 29, wherein the angular domains of the first and second arms are disjointed.

31. The MEMS device according to claim 28, wherein the second ends of the first and second arms are arranged at an angular distance of 180°.

32. The MEMS device according to claim 28, wherein the first ends of the first and second arms are arranged at an angular distance of 180°.

33. A MEMS device, comprising:
a fixed structure delimiting a cavity;
a suspended structure which overlies the cavity, the suspended structure comprising:
  an internal structure; and
  a first arm and a second arm which are arranged around the internal structure and each of the first and second arms having a respective first end and a respective second end, said first ends being fixed to the fixed structure and being angularly arranged at a distance apart, said second ends being fixed to the internal structure and being angularly arranged at a distance apart and being angularly arranged in a same direction of rotation with respect to the corresponding first ends;
  wherein, in a resting condition, each of the first and second arms has a respective elongated portion with a respective concavity, said internal structure extending in part within the concavities of the elongated portions of the first and second arms; and
a plurality of piezoelectric actuators coupled to the first arm and the second arm and configured when driven to cause a deformation of the arm to which the piezoelectric actuator is coupled and a consequent rotation of the internal structure;
wherein said internal structure comprises:
  a nested structure; and
  an outer frame of an annular shape, which surrounds the nested structure, and fixed to which are the second ends of the first and second arms; and
wherein the nested structure comprises:
  an inner frame; and
  a first secondary arm and a second secondary arm arranged around the inner frame and each of the first and second secondary arms having a respective first end and a respective second end, said first ends the first and second secondary arms being fixed to the outer frame and being angularly arranged at a distance apart, said second ends the first and second secondary arms being fixed to the inner frame and being angularly arranged at a distance apart and being arranged angularly in a same direction of rotation with respect to the corresponding first ends; and
  a further plurality of piezoelectric actuators coupled to the first secondary arm and the second secondary arm and configured when driven to cause a deformation of the secondary arm to which the piezoelectric actuator is coupled and a consequent rotation of the inner frame;
  wherein each of the first and second secondary arms comprises a respective elongated portion with a respective concavity; and wherein, in the resting condition, said inner frame extends in part within the concavities of the elongated portions of the first and second secondary arms.

34. The MEMS device according to claim 33, wherein, in the resting condition, said first and second arms extend around the internal structure on angular domains at least in part shifted and extending over an interval from about 65° to about 175°.

35. The MEMS device according to claim 34, wherein the angular domains of the first and second arms are disjointed.

36. The MEMS device according to claim 33, wherein the second ends of the first and second arms are arranged at an angular distance of 180°.

37. The MEMS device according to claim 33, wherein the first ends of the first and second arms are arranged at an angular distance of 180°.

38. A MEMS device, comprising:
a fixed structure delimiting a cavity;
a suspended structure which overlies the cavity, the suspended structure comprising:
  an internal structure; and
  a first arm and a second arm which are arranged around the internal structure and each of the first and second arms having a respective first end and a respective second end, said first ends being fixed to the fixed structure and being angularly arranged at a distance apart, said second ends being fixed to the internal structure and being angularly arranged at a distance apart and being angularly arranged in a same direction of rotation with respect to the corresponding first ends;
  wherein, in a resting condition, each of the first and second arms has a respective elongated portion with a respective concavity, said internal structure extending in part within the concavities of the elongated portions of the first and second arms;
a plurality of piezoelectric actuators coupled to the first arm and the second arm and configured when driven to cause a deformation of the arm to which the piezoelectric actuator is coupled and a consequent rotation of the internal structure; and
at least one first strain gauge and one second strain gauge, which are mechanically coupled, respectively, to the first and second arms, in symmetrical positions.

39. The MEMS device according to claim 38, wherein, in the resting condition, said first and second arms extend around the internal structure on angular domains at least in part shifted and extending over an interval from about 65° to about 175°.

40. The MEMS device according to claim 39, wherein the angular domains of the first and second arms are disjointed.

41. The MEMS device according to claim 38, wherein the second ends of the first and second arms are arranged at an angular distance of 180°.

42. The MEMS device according to claim 38, wherein the first ends of the first and second arms are arranged at an angular distance of 180°.

* * * * *